United States Patent [19]

Böhm et al.

[11] Patent Number: 4,755,476
[45] Date of Patent: Jul. 5, 1988

[54] PROCESS FOR THE PRODUCTION OF SELF-ADJUSTED BIPOLAR TRANSISTOR STRUCTURES HAVING A REDUCED EXTRINSIC BASE RESISTANCE

[75] Inventors: Willi R. Böhm, Unterhaching; Hans-Christian Schaber, Graefelfing, both of Fed. Rep. of Germany

[73] Assignee: Siemens Aktiengesellschaft, Berlin and Munich, Fed. Rep. of Germany

[21] Appl. No.: 931,802

[22] Filed: Nov. 17, 1986

[30] Foreign Application Priority Data

Dec. 17, 1985 [DE] Fed. Rep. of Germany ....... 3544573

[51] Int. Cl.$^4$ .......................................... H01L 21/265
[52] U.S. Cl. ..................... 437/31; 437/191; 437/233; 437/228; 156/657; 357/34; 357/59
[58] Field of Search .................... 29/591, 578, 576 C; 148/188, DIG. 9; 357/43, 34, 59 H; 156/653, 657; 437/31, 33, 46, 186, 191, 193, 195, 233, 238, 228

[56] References Cited

U.S. PATENT DOCUMENTS 4,188,707  2/1980  Asano et al. ............. 148/DIG. 124
4,481,706  11/1984 Roche ............................. 357/59 H
4,546,536  10/1985 Anantha et al. ................. 357/59 H

FOREIGN PATENT DOCUMENTS 3243059  5/1984  Fed. Rep. of Germany .
3402188  7/1985  Fed. Rep. of Germany .
3211752  9/1985  Fed. Rep. of Germany .

OTHER PUBLICATIONS

Ting, IEDM 84 Technical Digest 1984, pp. 110-113.
Wieder, Siemens Forsch-u. Entwicki (1984).

Primary Examiner—Olik Chaudhuri
Assistant Examiner—Kevin McAndrews
Attorney, Agent, or Firm—Hill, Van Santen, Steadman & Simpson

[57] ABSTRACT

Self-adjusted bipolar transistors having reduced extrinsic base resistance are produced by forming an emitter-terminal from a polysilicon layer structure and etching free the polysilicon layer structure using the emitter layer structure as a mask. Sidewall insulating layers are provided with a metallically conductive layer. This layer is self-adjusting in relation to the emitter zone and surrounds the emitter in an annular formation. The structure improves the foursided base wiring around the emitter and is used in the production of highly integrated bipolar circuits.

4 Claims, 1 Drawing Sheet

PROCESS FOR THE PRODUCTION OF SELF-ADJUSTED BIPOLAR TRANSISTOR STRUCTURES HAVING A REDUCED EXTRINSIC BASE RESISTANCE

BACKGROUND OF THE INVENTION

1. Field of the Invention

The present invention is in the field of producing bipolar transistor structures with self-adjusted emitter-base zones wherein both the emitter zone and the base zone in the substrate are produced by diffusion out of structures consisting of doped polysilicon layers which are directly deposited on the substrate and which form the later terminals. Using $SiO_2$ layers as masking and insulating layers, the base zone is first produced and then the emitter zone is produced centrally therein in such a manner that the active base zone is formed beneath the emitter zone and an inactive base zone is formed symmetrically therewith. Dry etching procedures which produce vertical etching profiles are used in order to structure the $SiO_2$ and polysilicon layers.

2. Description of the Prior Art

A process of the type herein described is disclosed in German OS No. 32 43 059 A1. The process described therein permits the production of bipolar transistor circuits in a high packing density which have high switching speeds and gates which permit greatly reduced gate transit times. In these bipolar circuits, the base terminal material consists of boron-doped polysilicon which, due to its excessively small grain size, results in undesirably high layer resistances which control the extrinsic base resistance of the self-adjusted bipolar transistors.

A reduction in the $p^+$(boron)-doped polysilicon layer resistance may be achieved by a process described in German OS No. 34 02 188.A1. In the process described in that patent, the boron-doped polycrystalline silicon layers are brought from the vaporous phase into the amorphous state by a chemical deposition process and are converted into the polycrystalline state in a later thermal process. These procedures serve to produce a larger grain size together with a smooth layer surface which results in the reduction of the layer resistance to approximately one-third of its normal value.

Another possibility of reducing the extrinsic base resistance consists in modifying the specific geometry. Thus, for example, the article by A. Wieder in the Siemens Research and Development Report, Volume 13 (1984), pp. 246 to 252, describes a reduction of extrinsic base resistance by use of two base terminals.

SUMMARY OF THE INVENTION

The present invention is directed to producing bipolar transistor structures having a polysilicon base terminal in which it is possible to reduce the extrinsic base resistance without changing the geometry; in particular, the foursided base-wiring around the emitter is improved.

The present invention further seeks to provide a process sequence suitable to integration within the above-described bipolar transistor structure in known CMOS procedures.

The object of the invention is fulfilled by a process of the type described modified to the extent that following the introduction of the polysilicon layer structure which forms the emitter terminal, the polysilicon layer structure which forms the base terminal is etched free with the emitter layer structure serving as a mask. Following the production of sidewall insulating layers on both layer structures, the exposed silicon surfaces are selectively provided with a metallically conductive layer. Silicides of metals having high melting points or the metals themselves which have high melting points such as tantalum, tungsten or platinum can be used as the metallically conductive layers.

The production of a metallically conductive layer which is self-adjusting in relation to the emitter zone and which surrounds the emitter in an annular formation not only results in a substantial reduction in the extrinsic base resistance but also serves to improve the foursided base-wiring around the emitter, i.e., during operation the emitter zone is enclosed in close proximity by an equipotential line at base potential.

The overall process for the production of bipolar transistors according to the present invention proceeds as follows:

(a) producing buried $n^+$-doped zones in a p-doped substrate by implantation of n-doping ions, (b) depositing an $n^-$-doped epitaxial layer in a thickness of from 0.5 to 2.0 microns, (c) implanting boron ions to produce channel-stop zones, (d) applying a double layer consisting of silicon oxide and silicon nitride and structuring of the silicon nitride layer for the succeeding local oxidation (LOCOS), (e) producing a field oxide to separate the active transistor zones in the substrate by local oxidation, after removal of the photo-resist mask, and using the silicon nitride structure as an oxidation mask, (f) removing the nitride/oxide mask, (g) producing the collector zones by implantation or diffusion of phosphorus using a photo-resist step, (h) applying a first high-temperature treatment, (i) depositing a $p^+$-conducting first layer of polysilicon onto the entire surface, (j) depositing an insulating layer onto the entire surface, (k) with the use of a photo-resist step, structuring the two last-named layers with vertical sidewalls until the substrate is exposed, using a dry etching procedure in order to define a base zone, (l) producing an active base zone by boron ion implantation, (m) depositing a second insulating layer and etching back this layer in order to produce sidewall insulations at the $p^+$-polysilicon edges, (n) depositing a second polysilicon layer onto the entire surface, (o) with a photo-resist step, structuring the second polysilicon layer so that the emitter and collector terminals are formed on the substrate, (p) applying an anisotropic etching process wherein the insulating layer which covers the $p^+$-conducting first polysilicon layer is removed until the $p^+$-conducting first polysilicon layer surface is exposed, (q) depositing a further insulating layer along the whole surface to provide a good edge cover of the structures of the $p^+$-conducting first polysilicon layer and the structures of the second polysilicon layer, (r) anisotropically etching the further insulating layer whereby insulating strips are formed at the sidewalls of the first polysilicon layer and the second polysilicon layer and the silicon surfaces of the first and second polysilicon layers are exposed, (s) implanting arsenic ions in the emitter and collector zones of the second polysilicon layer, while masking the other zones, (t) selectively depositing and forming a metal layer or a silicide layer following the removal of the mask on the exposed silicon surfaces, (u) applying a second high temperature step whereby the surfaces coated with a metal or silicide are converted into a stable silicide layer and the dopants diffuse out of the first polysilicon layer structure and the second polysilicon layer structure into the silicon substrate, and (v) producing an intermediate layer which serves as an insulating oxide, and opening the contact holes to the active transistor zone terminals consisting of the doped polysilicon structures.

In one form of the invention, the second high temperature step can be carried out by shock tempering, i.e., rapid annealing, at a temperature within the range of 1000° to 1200° C. for a maximum time of 60 seconds.

A variation of the process described may be achieved by carrying out the second high temperature step, process step (u), prior to a selective deposition of the metal or silicide layer set forth in process step (t).

DESCRIPTION OF THE PREFERRED EMBODIMENTS

Figure 1:
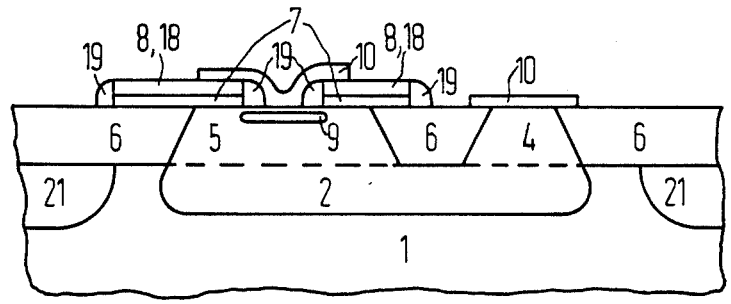
FIGS. 1–3 illustrate an exemplary embodiment to provide a more detailed description of the process sequence for the production of bipolar transistors in accordance with the invention. The sequence illustrated involves producing n-doped zones in the p-doped silicon substrate and positioning insulated npn-bipolar transistors in the n-doped zones. The n-zones form the collector of the bipolar transistor and the n-zones cover buried n+-doped zones which are connected by deeply extending collector terminals. Only those process steps which are essential to the invention have been shown in the sectional views of the Figures.

In FIG. 1 there is illustrated a structure produced by the following process steps, the first twelve steps being described, for example, in the Siemens Research and Development Report, Volume 13 (1984), pp. 246 to 252, which disclosure is incorporated herein by reference:

(a) forming a buried collector zone 2 in a p-doped silicon substrate 1 by masked ion implantation of antimony or arsenic at a dosage of $3 \times 10^{15}$ cm$^{-2}$, and an energy level of 80 keV, (b) depositing an n$^-$-doped epitaxial layer 5 having a concentration of $1 \times 10^{16}$ in a thickness of 0.5 to 2 microns, (c) implanting boron ions with diffusion in order to produce channel-stop zones 21. The function of these zones is to insure a reliable insulation between adjacent collector zones, i.e., avoidance of a parasitic thick oxide transistor, (d) applying a double layer consisting of silicon oxide and silicon nitride, with appropriate structuring of the silicon nitride layer for the succeeding LOCOS step, (e) applying a field oxide 6 which is required to separate the active transistor zones in the substrate 1 by means of local oxidation using the silicon nitride structure produced in accordance with step (d) as an oxidation mask, (f) removing the nitride/oxide mask, (g) producing the collector zones 4 by implantation or diffusion of phosphorus atoms with the use of a photo-resist step, (h) a first high temperature step at 900° to 1100° C. in which the collector terminal 4 is driven inwardly to the collector zone 2, (i) depositing a p+-conducting, first layer 7 of polysilicon over the entire surface, (j) depositing a first insulating layer 8 over the entire surface, (k) with the use of a photo-resist step, structuring of the two layers 7 and 8 with vertical sidewalls until the substrate 1 is exposed, using a dry etching procedure in order to define the base zone, (l) producing an active base zone 9 by boron ion implantation, (m) depositing a second insulating layer and etching back this layer in order to produce sidewall insulations 19 which function as spacers at the p+-polysilicon edges 7, (n) depositing a second polysilicon layer 10 onto the entire surface and (o) using a photoresist step, structuring the second polysilicon layer 10 in such a way that the emitter and collector terminals are formed on the substrate 1.

The field oxide zones or thick oxide zones can also be produced by other known processes such as silicon deep etching and local oxidation or by trench etching and filling the trench with insulating material.

Figure 2:
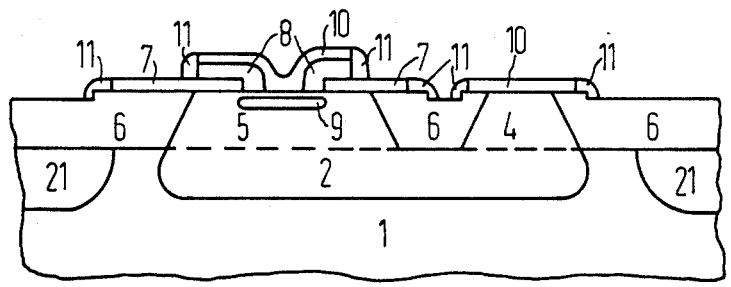

FIG. 2 shows the result of using an existing photoresist technique for the structuring of the second polysilicon layer 10 or using the polysilicon layer 10 itself as a mask. An anisotropic etching process, consisting of reactive ion etching in a trifluoromethane oxygen gas mixture is performed so that the insulating layer 8 which covers the first polysilicon layer 7 is removed until the p+-conducting first polysilicon layer 7 is exposed. The photo-resist mask is removed, if it has already not been removed, and a further insulating layer 11 which provides a good edge cover and which preferably consists of SiO$_2$ as a spacer oxide is applied. The spacer oxide layer 11 is structured by anisotropic etching consisting, for example, of reactive ion etching in a trifluoromethane oxygen gas mixture such that lateral insulating strips 11 remain only at the sidewalls of the first polysilicon layer structures 7 provided with the first spacer oxide 19 and the second polysilicon layer structures 10.

Then, if not performed previously, the doping of the second polysilicon layer can be effected by arsenic ion implantation while all the other zones are provided with a photoresist mask. The arsenic implantation at this stage is especially advantageous when the process of the invention is combined with a CMOS process in order to produce bipolar/CMOS circuits since this permits the simultaneous production of the n+ source/drain zones.

Figure 3:
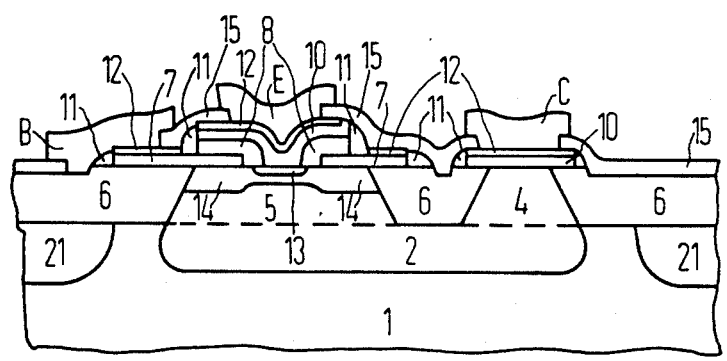

FIG. 3 illustrates an arrangement which is produced by the following succeeding steps:

(a) selective deposition of a metallically conductive layer 12 consisting, for example, of tungsten silicide or tantalum silicide as described in German Pat. No. 32 11 175 C2 or selective production of a silicide layer as known, for example, from the article by C. Y. Ting in IEDM Technical Digest (1984), pp. 110 to 113, on the silicon surfaces which have been exposed by the anisotropic etching of the polysilicon layer structures 7 and 10, (b) thermal treatment for diffusing-in the emitter zone 13 and 14 base zone 14 and for the formation of a stable silicide 12 on the emitter, base and collector terminal zones 7 and 10 which is carried out at approximately 900° C. for about 30 minutes, and (c) deposition of the intermediate oxide 15, formation of the contact holes, and metallization of the emitter (E), base (B) and collector terminals (C) in accordance with standard known process steps.

In a variation of the described process sequence, the thermal treatment for diffusing-in of the base and emitter 13 and 14 can also take place prior to the selective metal or silicide deposition. This permits the use of a metal or silicide which is non-resistant to high temperatures, for example, platinum silicide, for the self-adjusted contacting. Thus, the process is fully compatible with conventional platinum silicide/titanium-tungsten/aluminum metallization.

It should be evident that various modifications can be made to the described embodiments without departing from the scope of the present invention.

We claim as our invention:

1. A process for the production of bipolar transistors having buried collector zones and deeply extending collector terminals, comprising the sequence of the following process steps:
    (a) producing buried n+-doped zones in a p-doped substrate by implantation of n-doping ions,
    (b) depositing an n−-doped epitaxial layer in a layer thickness of 0.5 to 2.0 microns,
    (c) implanting boron ions to produce channel-stop zones,
    (d) applying a double layer consisting of silicon oxide and silicon nitride and structuring of the silicon nitride layer for the succeeding local oxidation,
    (e) producing a field oxide to separate the active transistor zones in the substrate by local oxidation using the silicon nitride structure as an oxidation mask,
    (f) removing the nitride/oxide mask,
    (g) producing the collector zones by implantation of phosphorus atoms,
    (h) applying a first high-temperature treatment,
    (i) depositing a p+-conducting first layer of polysilicon onto the entire surface,
    (j) depositing an insulating layer onto the entire surface,
    (k) structuring the two last-named layers with vertical sidewalls until the substrate is exposed, using a dry etching procedure in order to define a base zone,
    (l) providing an active base zone by boron ion implantation,
    (m) depositing a second insulating layer and etching back this layer in order to produce sidewall insulations at the p+-polysilicon edges,
    (n) depositing a second polysilicon layer onto the entire surface,
    (o) structuring of said second polysilicon layer so that the emitter and collector terminals are formed on the substrate,
    (p) applying an anisotropic etching process wherein the insulating layer which covers the p+-conducting first polysilicon layer surface is removed until the p+-conducting first polysilicon layer surface is exposed,
    (q) depositing a further insulating layer on the entire surface to provide a good edge cover of the structures of the p+-conducting first polysilicon layer and the structures of the second polysilicon layer,
    (r) anisotropically etching of said further insulating layer whereby insulating strips are formed at the sidewalls of the first polysilicon layer and the second polysilicon layer and whereby silicon surfaces of the first polysilicon layer and the second polysilicon layer are exposed,
    (s) implanting arsenic ions in the emitter and collector zones of said second polysilicon layer,
    (t) selectively depositing and forming a metal layer or a silicide layer on the exposed silicon surfaces,
    (u) applying a second high-temperature step such that the surfaces coated with metal or silicide are converted into a stable silicide layer and the dopants diffuse out of said first polysilicon layer structure and the second polysilicon layer structure into the silicon substrate, and
    (v) producing an intermediate layer which serves as an insulating oxide, and opening contact holes to the active transistor terminals consisting of the doped polysilicon structures.

2. A process as claimed in claim 1, wherein said first high-temperature treatment is carried out at a temperature of about 900° to 1100° C.

3. A process as claimed in claim 1, wherein said second high-temperature step is carried out by rapid annealing at a temperature in the range from 1000° to 1200° C. for a maximum time of 60 seconds.

4. A process as claimed in claim 1, wherein process step (u) is carried out prior to process step (t).

* * * * *